US012568751B2

(12) United States Patent
Li

(10) Patent No.: US 12,568,751 B2
(45) Date of Patent: Mar. 3, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventor: Ruoxiang Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 18/029,702

(22) PCT Filed: Feb. 25, 2022

(86) PCT No.: PCT/CN2022/078054
§ 371 (c)(1),
(2) Date: Mar. 31, 2023

(87) PCT Pub. No.: WO2023/159501
PCT Pub. Date: Aug. 31, 2023

(65) Prior Publication Data
US 2024/0365647 A1 Oct. 31, 2024

(51) Int. Cl.
*H10K 59/80* (2023.01)
*H10K 59/131* (2023.01)
*H10K 59/38* (2023.01)

(52) U.S. Cl.
CPC ......... *H10K 59/879* (2023.02); *H10K 59/131* (2023.02); *H10K 59/38* (2023.02)

(58) Field of Classification Search
CPC .... H10K 59/879; H10K 59/131; H10K 59/38; H10K 59/00; H10K 59/8792
See application file for complete search history.

(56) References Cited

U.S. PATENT DOCUMENTS 11,038,151 B2 6/2021 Ju et al.
2014/0034919 A1 2/2014 Park et al.
(Continued)

FOREIGN PATENT DOCUMENTS

CN 110379940 A 10/2019
CN 111475042 A 7/2020
(Continued)

OTHER PUBLICATIONS

International Search Report and Written Opinion mailed on Nov. 4, 2022, in corresponding PCT/CN2022/078054, 10 pages.

*Primary Examiner* — James R Greece
*Assistant Examiner* — Jose M Diaz
(74) *Attorney, Agent, or Firm* — XSENSUS LLP

(57) ABSTRACT

A display panel includes: a display substrate, including a plurality of sub-pixels; a first light extraction layer, arranged on a light output side of the display substrate, where the first light extraction layer includes a plurality of first protrusions, and an orthographic projection of the first protrusions on the display substrate overlaps with an orthographic projection of the sub-pixels on the display substrate; and a second light extraction layer, arranged on the light output side of the display substrate and covering at least part of the first protrusions, where the second light extraction layer includes a plurality of first grooves, the orthographic projection of the first protrusions on the display substrate overlaps with an orthographic projection of the first grooves on the display substrate, and a refractive index of the second light extraction layer is smaller than a refractive index of the first light extraction layer.

20 Claims, 9 Drawing Sheets

(56) References Cited

U.S. PATENT DOCUMENTS

| 2020/0243802 | A1 | | 7/2020 | Ju et al. | |
|---|---|---|---|---|---|
| 2020/0343317 | A1 | * | 10/2020 | Park | ........................ H10K 59/35 |

FOREIGN PATENT DOCUMENTS

| CN | 111834544 | A | 10/2020 |
|---|---|---|---|
| CN | 111834545 | A | 10/2020 |
| CN | 212873152 | U | 4/2021 |
| CN | 110379940 | B | 9/2021 |
| CN | 114068844 | A | 2/2022 |
| CN | 111834544 | B | 8/2022 |
| CN | 111834545 | B | 10/2022 |
| JP | 2004-177481 | A | 6/2004 |
| JP | 4239569 | B2 | 3/2009 |
| KR | 2014-0018548 | A | 2/2014 |

* cited by examiner

DISPLAY PANEL AND DISPLAY DEVICE

CROSS-REFERENCE TO RELATED APPLICATION

The present application is the U.S. National Phase Application of PCT Application No. PCT/CN2022/078054, filed Feb. 25, 2022, the entire contents of which are incorporated herein by reference in their entirety.

TECHNICAL FIELD

This disclosure relates to the field of display technology, and in particular, to a display panel and a display device.

BACKGROUND

With the development of technology and the improvement of social living standards, consumers have increasingly higher requirements for display products. For display manufacturers, the production of high-resolution and high-quality display products is a definite direction of development.

However, the light extraction efficiency of current display products is relatively low.

It should be noted that the information disclosed in this background section is only for enhancing the understanding of the background of this disclosure, and therefore may include information that does not constitute the prior art known to those of ordinary skill in the art.

SUMMARY

This disclosure is directed to overcome the shortcomings of the above-mentioned related art, and provides a display panel and a display device.

According to an aspect of this disclosure, a display panel is provided, including:

a display substrate, including a plurality of sub-pixels;

a first light extraction layer, arranged on a light output side of the display substrate, where the first light extraction layer includes a plurality of first protrusions, and an orthographic projection of the first protrusions on the display substrate overlaps with an orthographic projection of the sub-pixels on the display substrate; and a second light extraction layer, arranged on the light output side of the display substrate and covering at least part of the first protrusions, where the second light extraction layer includes a plurality of first grooves, the orthographic projection of the first protrusions on the display substrate overlaps with an orthographic projection of the first grooves on the display substrate, and a refractive index of the second light extraction layer is smaller than a refractive index of the first light extraction layer.

In some embodiments of the disclosure, the display panel further includes:

a third light extraction layer, arranged on a side of at least part of the second light extraction layer away from the display substrate, where at least part of the third light extraction layer is located within the first groove, and a refractive index of the third light extraction layer is greater than the refractive index of the second light extraction layer.

In some embodiments of the disclosure, a height of a sidewall of the first protrusion in a second direction decreases with increase of a distance from the sidewall to a center of the sub-pixel in a first direction, the second direction is perpendicular to a display surface of the display substrate, and the first direction is parallel to the display surface of the display substrate.

In some embodiments of the disclosure, the sub-pixel is located on a same side of a first normal line L1 of the sidewall of the first protrusion, and are located on a side of the first normal line L1 away from the second light extraction layer.

In some embodiments of the disclosure, an angle between the sidewall of the first protrusion and the display surface of the display substrate is $\alpha$, and $$\alpha \geq \arctan\left[(a+b)/h\right];$$

where a is a distance between an edge of the first protrusion and an edge of the sub-pixel in the first direction, b is a length of the sub-pixel in the first direction, and h is a distance between the first protrusion and the sub-pixel in the second direction.

In some embodiments of the disclosure, a height of a groove sidewall of the first groove in the second direction increases with increase of a distance from the groove sidewall to the center of the sub-pixel in the first direction.

In some embodiments of the disclosure, an angle between the groove sidewall of the first groove and the display surface of the display substrate is $\beta$, $$\beta > \arctan\left[h/(a+b)\right];$$

where a is a distance between an edge of the first protrusion and an edge of the sub-pixel in the first direction, b is a length of the sub-pixel in the first direction, and h is a distance between the first protrusion and the sub-pixel in the second direction.

In some embodiments of the disclosure, the display panel further includes:

a color filter layer, arranged on the light output side of the display substrate, where the color filter layer includes a filter portion and a light shielding portion.

In some embodiments of the disclosure, the color filter layer is arranged on a side of the second light extraction layer away from the display substrate, and at least part of the filter portion is used as the third light extraction layer.

In some embodiments of the disclosure, the filter portion includes a first part and a second part stacked in sequence, the first part is closer to the second light extraction layer than the second part, and the first part is used as a second protrusion of the third light extraction layer.

In some embodiments of the disclosure, a height of a groove sidewall of the first groove in the second direction decreases with increase of a distance from the groove sidewall to the center of the sub-pixel in the first direction.

In some embodiments of the disclosure, the sidewall of the first protrusion is located on a same side of a second normal line of the groove sidewall of the first groove, and is located on a side of the second normal line close to the display substrate, and the sidewall of the first protrusion and the groove sidewall of the first groove are located on a same side of a same section along the second direction.

In some embodiments of the disclosure, the third light extraction layer is disposed within the first groove, and the third light extraction layer disposed within the first groove is a second protrusion.

In some embodiments of the disclosure, the second light extraction layer includes:

a first layer, arranged on the light output side of the display substrate and covering at least part of the first protrusions; and a second layer, arranged on a side of the first layer away from the display substrate, where the first grooves are arranged at the second layer.

In some embodiments of the disclosure, the display panel further includes:

a color filter layer, arranged on a side of the first light extraction layer and the first layer away from the display substrate, where the color filter layer includes a filter portion and a light shielding portion, and the second layer is located on a side of the color filter layer away from the display substrate.

In some embodiments of the disclosure, at least part of the filter portion is used as the third light extraction layer.

In some embodiments of the disclosure, the filter portion includes a first part and a second part stacked in sequence, and the first part is closer to the second light extraction layer than the second part, and the second part is used as the third light extraction layer.

In some embodiments of the disclosure, the second light extraction layer further includes:

a third layer, arranged between the first layer and the second layer, and located on the side of the color filter layer away from the display substrate.

In some embodiments of the disclosure, the first groove is provided as a via hole.

In some embodiments of the disclosure, the display panel further includes:

an encapsulation layer group, arranged between the display substrate and the first light extraction layer;

a circular polarizer, located on a side of the third light extraction layer away from the display substrate; and a cover plate, arranged on a side of the circular polarizer away from the display substrate.

According to another aspect of this disclosure, a display device is provided, including the display panel described in any one of the above embodiments.

It is to be understood that both the foregoing general description and the following detailed description are exemplary and explanatory only and are not restrictive of this disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of this disclosure, and those skilled in the art can obtain other drawings according to these drawings without creative efforts.

DESCRIPTION OF REFERENCE SIGNS

Figure 1:
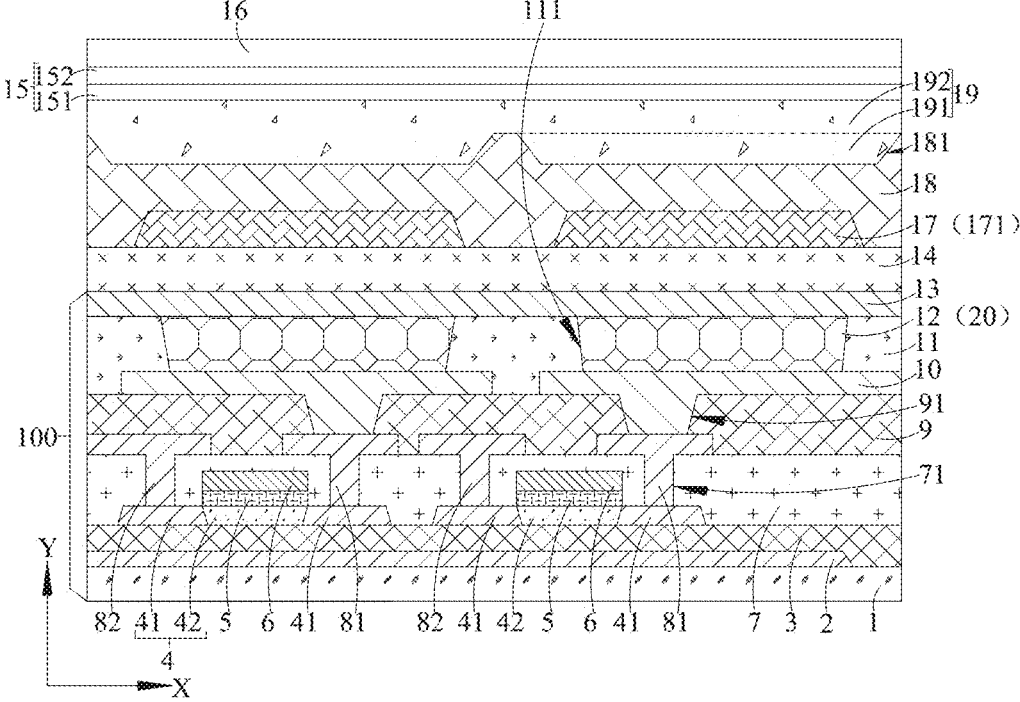
FIG. 1 is a schematic structural diagram of the display panel according to a first exemplary embodiment of this disclosure.

1. Base substrate; 2. Light shielding layer; 3. Buffer layer; 4. Active layer; 41. Conductor portion; 42. Channel portion;
5. Gate insulating layer; 6. Gate;
7. Interlayer dielectric layer; 71. First via hole;
81. Source; 82. Drain;
9. Planarization layer; 91. Second via hole;
10. First electrode;
11. Pixel definition layer; 111. Third via hole;
12. Light emitting layer group; 13. Second electrode;
14. Encapsulation layer group;
15. Circular polarizer; 151. ¼ wave plate; 152. Polarizer;
16. Cover plate;
17. First light extraction layer; 171. First protrusion;
18. Second light extraction layer; 181. First groove; 182. First layer; 183. Second layer; 184. Third layer;
19. Third light extraction layer; 191. Second protrusion; 192. Flat portion;
20. Sub-pixel;
21. Color filter layer; 211. Filter portion; 2111. First part; 2112. Second part; 2113. Third part; 212. Shading part; 2121. Fourth via hole;
X. First direction; Y. Second direction; 100. Display substrate.

DETAILED DESCRIPTION

Exemplary embodiments will now be described more fully with reference to the accompanying drawings. Exemplary embodiments may, however, be embodied in many forms and should not be construed as limited to the embodiments set forth herein. Instead, these embodiments are provided so that this disclosure will be thorough and complete, and will fully convey the concept of exemplary embodiments to those skilled in the art. The same reference numerals in the drawings denote the same or similar structures, and thus their detailed descriptions will be omitted. Furthermore, the drawings are merely schematic illustrations of this disclosure and are not necessarily drawn to scale.

Although relative terms such as "upper" and "lower" are used in this specification to describe the relative relationship of one component as illustrated to another component, these terms are used in this specification only for convenience, for example, according to the directions of the example described with reference to the drawings. It will be appreciated that if the illustrated device is turned over so that it is upside down, then elements described as being "upper" will become elements that are "lower". When a structure is "on" another structure, it may mean that the structure is integrally formed on another structure, or that the structure is "directly" placed on another structure, or that the structure is "indirectly" placed on another structure through still another structure.

The terms "a", "an", "the", "said" and "at least one" are used to indicate the presence of one or more elements/components and the like; the terms "including/comprising" and "have" are used to indicate an nonexclusive meaning and refer to that there may be additional elements/components and the like in addition to the listed elements/components and the like. The terms "first", "second", "third" and the like are only used as a marker, not a limit on the number of objects related thereto.

Exemplary embodiments of this disclosure provide a display panel. Referring to FIG. 1 to FIG. 17, the display panel includes a display substrate 100, a first light extraction layer 17 and a second light extraction layer 18. The display substrate 100 includes a plurality of sub-pixels 20. The first light extraction layer 17 is arranged on a light output side of the display substrate 100, the first light extraction layer 17 may include a plurality of first protrusions 171, and an orthographic projection of the first protrusions 171 on the display substrate 100 overlaps with an orthographic projection of the sub-pixels 20 on the display substrate 100. The second light extraction layer 18 is arranged on the light output side of the display substrate 100 and covers at least part of the first protrusions 171, and the second light extraction layer 18 may include a plurality of first grooves 181. The orthographic projection of the first protrusions 171 on the display substrate 100 overlaps with an orthographic projection of the first grooves 181 on the display substrate 100, and a refractive index of the second light extraction layer 18 is smaller than that of the first light extraction layer 17.

It should be noted that the "overlap" may be partial overlapping or full overlapping.

When referring to that the orthographic projection of the first protrusions 171 on the display substrate 100 overlaps with the orthographic projection of the sub-pixels 20 on the display substrate 100, the orthographic projection of the first protrusions 171 on the display substrate 100 may partially overlap with the orthographic projection of the sub-pixels 20 on the display substrate 100, or the orthographic projection of the first protrusions 171 on the display substrate 100 may completely overlap with the orthographic projection of the sub-pixels 20 on the display substrate 100. For example, the orthographic projection of the first protrusions 171 may completely cover the sub-pixels 20, or, the orthographic projection of the first protrusions 171 on the display substrate 100 may be located within the sub-pixels 20. As long as there is overlapping between the orthographic projection of the first protrusions 171 on the display substrate 100 and that of the sub-pixels 20, the first protrusions 171 can converge at least part of light to achieve the purpose of improving light extraction efficiency.

When referring to that the orthographic projection of the first protrusions 171 on the display substrate 100 overlaps with the orthographic projection of the first grooves 181 on the display substrate 100, the orthographic projection of the first protrusions 171 on the display substrate 100 may partially overlap with the orthographic projection of the first grooves 181 on the display substrate 100, or the orthographic projection of the first protrusions 171 on the display substrate 100 may completely overlap with the orthographic projection of the first grooves 181 on the display substrate 100. For example, the orthographic projection of the first protrusions 171 on the display substrate 100 may be located within the orthographic projection of the first grooves 181 on the display substrate 100, or the orthographic projection of the first grooves 181 on the display substrate 100 may be located within the orthographic projection of the first protrusions 171 on the display substrate 100. As long as there is overlapping between the orthographic projection of the first protrusions 171 on the display substrate 100 and the orthographic projection of the first grooves 181 on the display substrate 100, the first grooves 181 can converge at least part of light to achieve the purpose of improving light extraction efficiency.

Based on the display panel according to this disclosure, almost all the light emitted from the sub-pixels 20 irradiates the first protrusions 171. The incident angle of the central light is small so that total reflection does not occur, and it passes through the first light extraction layer 17 and the second light extraction layer 18 for emission. The incident angle of the peripheral light is relatively large, and total reflection may occur at the sidewall of the first protrusions 171. Alternatively, the incident angle formed by part of the peripheral light and the sidewall of the first protrusions 171 is also small, the outgoing light emitted from the sub-pixels 20 may be refracted at the sidewall to generate refracted light. Moreover, since the refractive index of the second light extraction layer 18 is smaller than that of the first light extraction layer 17, the refracted light is more convergent, thereby improving the light extraction efficiency at the front surface of the display panel. Therefore, under the same brightness requirements, the power consumption of the display panel can be reduced: the light extraction efficiency at the side surface of the display panel can be reduced to increase the anti-peeping effect. The groove sidewall of the first grooves 181 forms a refraction surface or total reflection surface, the refracted light is totally reflected or refracted again at the groove sidewall of the first grooves 181, and the angle of the refracted light is changed, so that the outgoing light can be emitted in a direction substantially perpendicular to the display surface of the display substrate 100, thereby further improving the light extraction efficiency at the front surface of the display panel. Therefore, under the same brightness requirements, the power consumption of the display panel can be further reduced: the light extraction efficiency at the side surface of the display panel can be reduced to increase the anti-peeping effect; and the cross-color can be reduced to improve the display effect.

The display substrate 100 may be an OLED (Organic Electroluminescence Display) display substrate, a QLED (Quantum Dot Light Emitting Diodes) display substrate 100, and the like. The display substrate 100 has a light output side and a non-light output side, and the light output side is arranged opposite to the non-light output side. A screen may be displayed at the light output side, and the side of displaying the screen is a display surface. OLED display substrates have the characteristics of self-illumination, high brightness, wide viewing angle, and fast response time, and R, G, and B full-color components therein can be produced, so they are regarded as star products of next-generation displays.

Referring to FIG. 1, OLED is taken as an example for description below:

The display substrate 100 may include a driving backplane and a light emitting device, the driving backplane may include a driving circuit, and the driving circuit may drive the light emitting device to emit light.

In some exemplary embodiments, the driving backplane may include a base substrate 1, and the material of the base substrate 1 may include an inorganic material, for example, the inorganic material may be glass, quartz, or metal. The material of the base substrate 1 may also include an organic material, for example, the organic material may be a resin material such as polyimide, polycarbonate, polyacrylic ester, polyetherimide, polysulfone, polyethylene terephthalate glycol and polyethylene naphthalate glycol. The base substrate 1 may be formed of multiple material layers, for example, the base substrate 1 may include multiple base layers, and the material of the base layer may be any one of the above-mentioned materials. Alternatively, the base substrate 1 may also be provided as a single layer, which may be any one of the above materials.

A light shielding layer 2 may also be formed on one side of the base substrate 1, and the light incident from the base substrate 1 into the active layer 4 may generate photocarriers in the active layer 4, thereby having a huge impact on the characteristics of the thin film transistor and, further, affecting the display quality of the display device. The light incident from the base substrate 1 can be blocked by the light shielding layer 2, so as to avoid affecting the characteristics of the thin film transistor and the display quality of the display device.

A buffer layer 3 may also be formed on one side of the light shielding layer 2 away from the base substrate 1. The buffer layer 3 plays the role of blocking water vapor and impurity ions in the base substrate 1 (especially organic materials), and serves to increase hydrogen ions for the active layer 4 formed subsequently. The material of the buffer layer 3 is an insulating material, which can insulate and isolate the light shielding layer 2 from the active layer 4.

The active layer 4 is provided on one side of the buffer layer 3 away from the base substrate 1, the active layer 4 may include a channel portion 42 and a conductor portion 41 arranged at both ends of the channel portion 42. A gate insulating layer 5 is disposed on one side of the active layer 4 away from the base substrate 1, a gate 6 is disposed on one side of the gate insulating layer 5, and an interlayer dielectric layer 7 is disposed on one side of the gate 6 away from the base substrate 1. A first via hole 71 is provided on the interlayer dielectric layer 7, and the first via hole 71 is connected to the conductor portion 41. A source 81 and a drain 81 are provided on one side of the interlayer dielectric layer 7 away from the base substrate 1, and the source 81 and the drain 82 are respectively connected to two conductor portions 41 through two first via holes 71. A planarization layer 9 is provided on one side of the source 81 and the drain

82 away from the substrate 1, a second via hole 91 is provided on the planarization layer 9, and the second via hole 91 is connected to the source 81. The active layer 4, the gate 6, the source 81 and the drain 82 form a thin film transistor.

It should be noted that the thin film transistor described in this specification may be a top-gate thin film transistor. In some other exemplary embodiments of this disclosure, the thin film transistor may also be a bottom-gate or double-gate type, and the specific structure thereof will not be described here. Furthermore, when using thin film transistors with opposite polarities or when the direction of current changes during circuit operation, the functions of the "source 81" and "drain 82" may be interchanged. Therefore, in this specification, "source 81" and "drain 82" may be interchanged with each other.

A light emitting device is disposed on one side of the planarization layer 9 away from the base substrate 1, and the light emitting device may include a first electrode 10, a pixel definition layer 11, a light emitting layer group 12 and a second electrode 13.

Specifically, a first electrode 10 is provided on the side of the planarization layer 9 away from the base substrate 1, the first electrode 10 is connected to the source 81 of the driving backplane through the second via hole 91, and the first electrode 10 may be an anode.

The pixel definition layer 11 is disposed on one side of the first electrode 10 away from the base substrate 1, a third via hole 111 is disposed on the pixel definition layer 11, and the light emitting layer group 12 is disposed in the third via hole 111. A second electrode 13 is provided on one side of the light emitting layer group 12 away from the base substrate 1, the second electrode 13 may be a cathode, and the second electrode 13 is connected to a ground line VSS. The light emitting layer group 12 in one third via hole 111 emits light to form one sub-pixel 20. Therefore, the light emitting layer group 12 in one third via hole 111 is one sub-pixel 20, so that the orthographic projection of the sub-pixel 20 on the display substrate 100 is the orthographic projection of the light emitting layer group 12 on the display substrate 100, and the display substrate 100 may include a plurality of sub-pixels 20.

The light emitting layer group 12 may include a hole injection layer, a hole transport layer, a light emitting layer, an electron transport layer, and an electron injection layer stacked in sequence. The hole injection layer is in contact with the first electrode 10, and the electron injection layer is in contact with the second electrode 13. Alternatively, in some other exemplary embodiments of this disclosure, the light emitting layer group 12 may only include a hole transport layer, a light emitting layer and an electron transport layer. The light emitting layer group 12 may also have other structures, and its specific structure may be provided as required.

An encapsulation layer group 14 is arranged on one side of the second electrode away from the base substrate 1, the encapsulation layer group 14 may be arranged as a multilayer structure, the encapsulation layer group 14 may include an organic layer(s) and an inorganic layer(s), and the specific materials and number of layers thereof are not elaborated here.

The first light extraction layer 17 is disposed on one side of the encapsulation layer group 14 away from the base substrate 1, and the first light extraction layer 17 may include a plurality of first protrusions 171.

Figure 2:
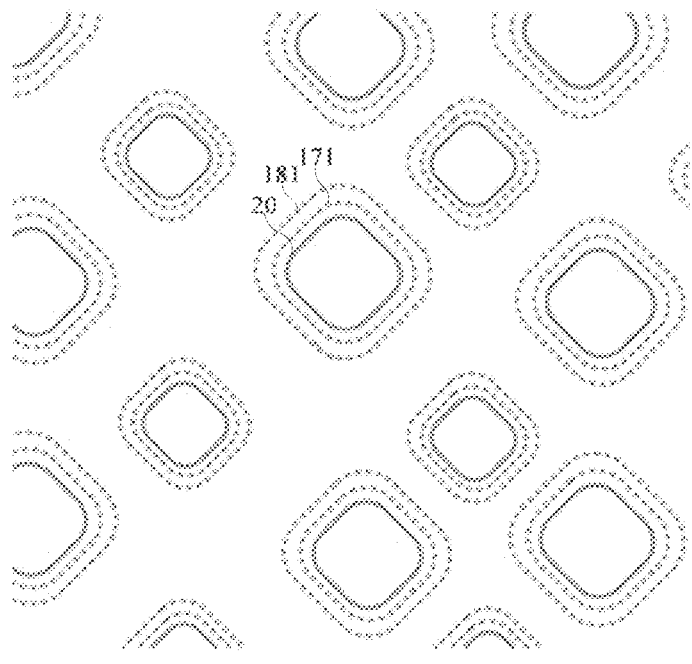
FIG. 2 is a schematic top view of the display panel in FIG. 1.

Referring to FIG. 2, there is a one-to-one correspondence between the first protrusions 171 and the sub-pixels 20.

Specifically, the number of the first protrusions 171 is the same as the number of the sub-pixels 20, and the shape of the first protrusions 171 is the same as that of the sub-pixels 20. For example, the sub-pixel 20 is provided as a circle, and the first protrusion 171 is also provided as a circle; the sub-pixel 20 is provided as a rectangle, and the first protrusion 171 is also provided as a rectangle. In some other exemplary embodiments, the shape of the sub-pixel 20 and the shape of the first protrusion 171 may also be other shapes, which will not be described here.

The orthographic projection of the first protrusion 171 on the display substrate 100 covers the sub-pixel 20, that is, the orthographic projection of the first protrusion 171 on the display substrate 100 coincides with the sub-pixel 20, or the edge of the sub-pixel 20 is located within the border of the orthographic projection of the first protrusion 171 on the display substrate 100.

The first protrusion 171 may include a bottom wall, a top wall and a sidewall, the bottom wall and the top wall are parallel to the display surface, and the sidewall intersects the display surface. The height of the sidewall of the first protrusion 171 in the second direction Y decreases as the distance from the sidewall to the center of the sub-pixel 20 in the first direction X increases, where the second direction Y is perpendicular to the display surface of the display substrate 100, and the first direction X is parallel to the display surface of the display substrate 100. For example, the sidewall of the first protrusion 171 may be formed as an inclined surface, and make the first protrusion present a structure that shrinks as the distance from the display substrate 100 increases. In this way, the incident angle at the sidewall of the first protrusion 171 is relatively small, so as to avoid the total reflection of the outgoing light, but to allow the outgoing light to be refracted.

Alternatively, in some other exemplary embodiments of this disclosure, the edge of the top wall of the first protrusion 171 may be rounded, that is, the top wall and the sidewall of the first protrusion 171 may be smoothly connected with each other by a circular arc; or the sidewall of the first protrusion 171 may be formed as an arc surface, that is, the first protrusion 171 may be a truncated hemisphere or less hemispherical structure.

Figure 3:
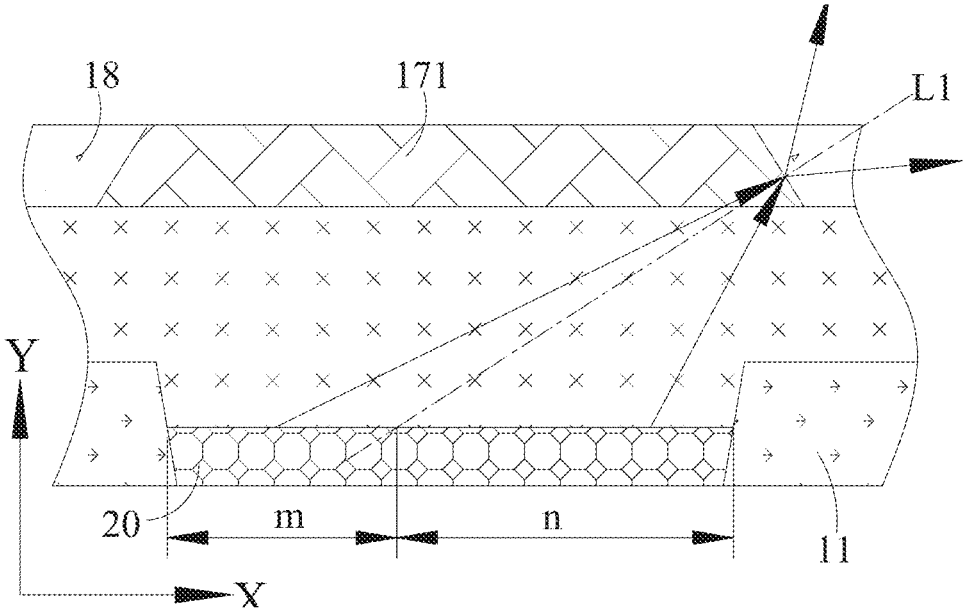
FIG. 3 is a first schematic diagram illustrating refraction principle of the sidewall of the first protrusion.

Referring to FIG. 3, when the sub-pixel 20 is located on both sides of the first normal line L1 of the sidewall of the first protrusion 171, different parts may produce two completely opposite refraction effects. Specifically, the outgoing light emitted from the segment m is refracted by a part of the sidewall close to the base substrate 1, so that the refracted light is more dispersed; while the outgoing light emitted from the segment n is refracted by a part of the sidewall away from the base substrate 1, so that the refracted light is more convergent and can be emitted from the front of the display panel, thereby improving the light extraction efficiency of the display panel.

Figure 4:
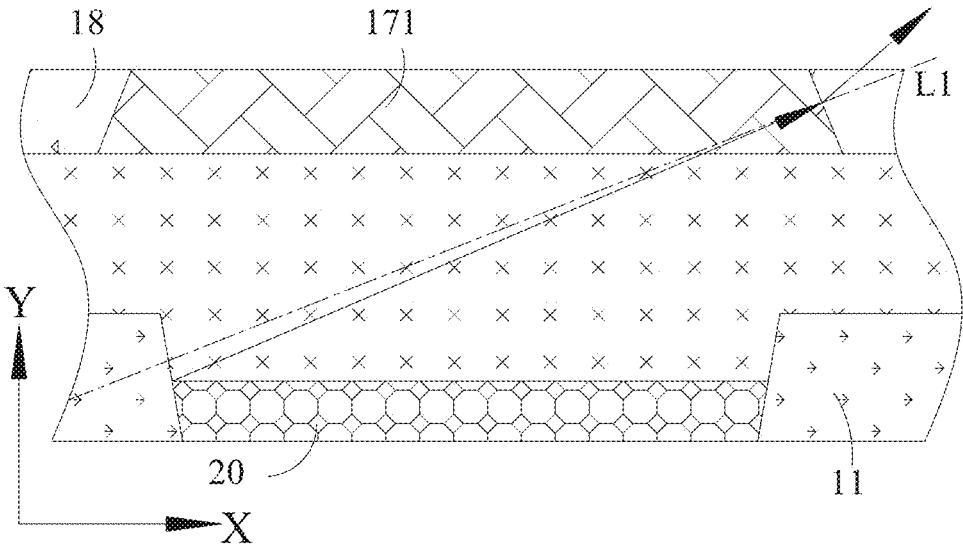
FIG. 4 is a second schematic diagram illustrating refraction principle of the sidewall of the first protrusion.

Therefore, referring to FIG. 4, in order to make all the outgoing light emitted by the sub-pixel 20 pass through the first protrusion 171 to produce a converging effect, the sub-pixel 20 is to be arranged on the same side of the first normal line L1 of the sidewall of the first protrusion 171, and on one side of the first normal line L1 away from the second light extraction layer 18, that is, the whole sub-pixel 20 is located on the side where the segment n is located. The angle of the emitted light is fixed, so the above purpose can be achieved by adjusting the inclination of the sidewall of the first protrusion 171, that is, adjusting the angle between the sidewall of the first protrusion 171 and the display surface of the display substrate 100.

Figure 5:
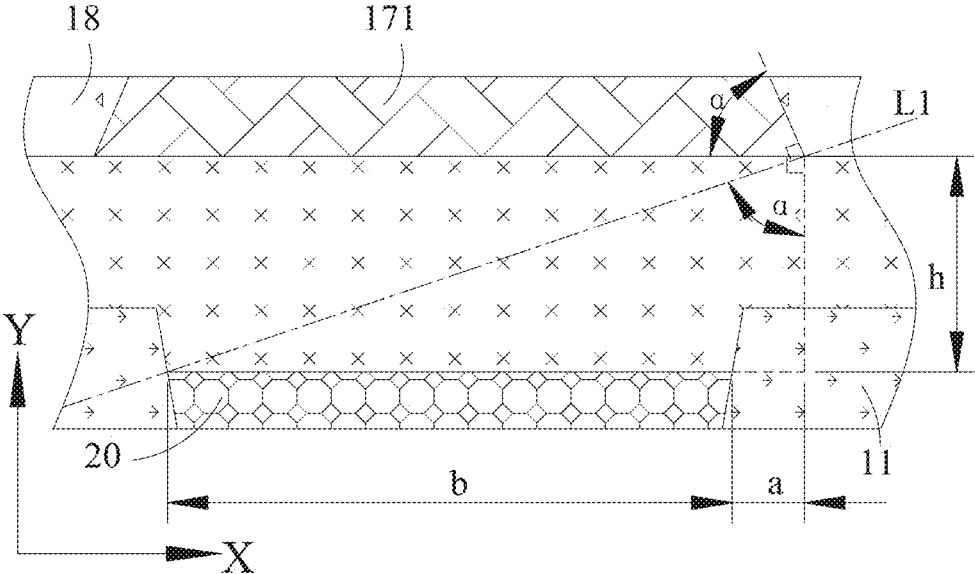
FIG. 5 is a schematic diagram illustrating calculation principle of the critical value of the inclination angle for the sidewall of the first protrusion.

Referring to FIG. 5, the angle between the sidewall of the first protrusion 171 and the display surface of the display substrate 100 is α, that is, the inclination angle of the sidewall of the first protrusion 171 is α. When the inclination angle α of the first protrusion 171 is the smallest, the first normal line L1 of the sidewall connects opposite sides of the sub-pixel 20 and the first protrusion 171, therefore, $$\alpha \geq \arctan\left[(a + b)/h\right];$$

Herein, a is the distance between an edge of the first protrusion 171 and an edge of the sub-pixel 20 in the first direction X, and the edge of the first protrusion 171 and the edge of the sub-pixel 20 are edges at the same side on a same section, where the section is also a section along the second direction Y, and a value of a is greater than zero; b is a length of the sub-pixel 20 in the first direction X; and h is a distance between the first protrusion 171 and the sub-pixel 20 in the second direction Y.

When the pixel density of the display substrate 100 is 400, it can be calculated that the included angle α≥70° between the sidewall of the first protrusion 171 and the display surface of the display substrate 100. When the pixel density increases, b may shrink to a certain extent, and the minimum degree (critical angle) of the included angle α may also decrease to a certain extent.

The thickness of the first protrusion 171 is greater than or equal to 1 micron and less than or equal to 5 microns.

When the included angle α is smaller than the critical angle, there is also a certain converging effect on the outgoing light.

Figure 6:
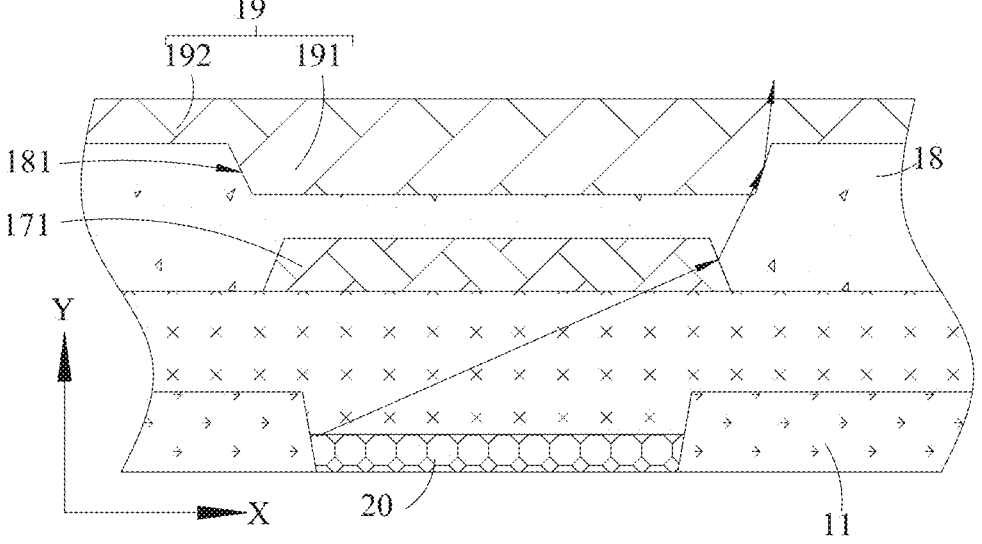
FIG. 6 is a schematic diagram illustrating an optical path of the display panel in FIG. 1.

Referring to FIG. 1 and FIG. 6, the second light extraction layer 18 is provided on the light output side of the display substrate 100, and the second light extraction layer 18 covers at least part of the first protrusion 171. In other words, a part of the second light extraction layer 18 is located on the light output side of the display substrate 100, and another part of the second light extraction layer 18 is located on one side of at least part of the first protrusion 171 away from the display substrate 100.

The second light extraction layer 18 may include a plurality of first grooves 181, and the first grooves 181 correspond to the first protrusions 171 one by one. Specifically, the number of the first grooves 181 is the same as the number of the first protrusions 171, and the shape of the first grooves 181 is the same as that of the first protrusions 171. For example, the first protrusions 171 are formed to be circular, the first grooves 181 are also formed to be circular, the first protrusions 171 are formed to be rectangular, and the first grooves 181 are also formed to be rectangular. In some other exemplary embodiments of this disclosure, the shape of the first protrusions 171 and the shape of the first grooves 181 may also be other shapes, which will not be described here.

The thickness of the second light extraction layer 18 is greater than 0 and less than or equal to 5 microns, and the depth of the first groove 181 is greater than 0 and less than or equal to 5 microns.

Referring to FIG. 2, the orthographic projection of the first protrusion 171 on the display substrate 100 is located within the orthographic projection of the first groove 181 on the display substrate 100. In other words, the edge of the orthographic projection of the first protrusion 171 on the display substrate 100 coincides with the edge of the orthographic projection of the first groove 181 on the display substrate 100, or the edge of the orthographic projection of the first protrusion 171 on the display substrate 100 is located within the edge of the orthographic projection of the first groove 181 on the display substrate 100.

The refractive index of the second light extraction layer 18 is smaller than that of the first light extraction layer 17, so that the light emitted from the sidewall of the first protrusion 171 to the second light extraction layer 18 is bent toward the side away from the display substrate 100. Therefore, the refracted light can be more concentrated, and can be emitted from the front of the display panel, thereby improving the light extraction efficiency of the display panel.

The first groove 181 may include a groove bottom wall and a groove sidewall, the groove bottom wall is parallel to the display surface, and the groove sidewall intersects the display surface. The height of the groove sidewall of the first groove 181 in the second direction Y increases as the distance from the groove sidewall to the center of the sub-pixel 20 in the first direction X increases. For example, the groove sidewall of the first groove 181 may be formed as a slope, so that the first groove 181 presents a structure that expands as the distance from the display substrate 100 increases. Such setting makes the incident angle of the refracted light at the groove sidewall of the first groove 181 relatively large, so that the refracted light may be totally reflected on the groove sidewall of the first groove 181.

In some other exemplary embodiments of this disclosure, the edge of the groove bottom wall of the first groove 181 may be rounded, that is, the groove bottom wall and the groove sidewall of the first groove 181 are smoothly connected through a circular arc. The edge of the groove sidewall of the first groove 181 away from the groove bottom wall may also be rounded. One or both of the above two rounded chamfers may be provided. The groove sidewall of the first groove 181 may be formed as an arc surface.

When the outgoing light irradiates the groove sidewall of the first groove 181 after being refracted by the sidewall of the first protrusion 171, if the angle between the refracted light and the display surface is greater than the inclination angle β of the groove sidewall of the first groove 181, the refracted light may not be totally reflected, causing the groove sidewall of the first groove 181 to fails in its function. Therefore, the inclination angle β of the groove sidewall of the first groove 181 is to be limited, for example, as follows.

Figure 7:
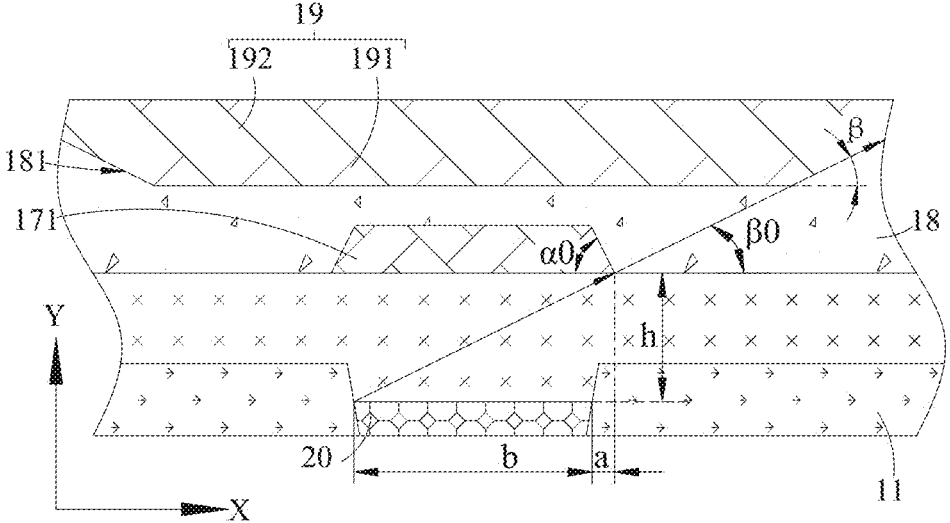
FIG. 7 is a schematic diagram illustrating calculation principle of the critical value of the inclination angle for the groove sidewall of the first groove.

Referring to FIG. 7, from the above description of the inclination angle of the sidewall of the first protrusion, it can be known that the inclination angle of the sidewall of the first protrusion has a minimum value α0. When the inclination angle of the sidewall of the first protrusion is taken as the minimum value α0, the outgoing light emitted from the sub-pixel 20 on the side opposite to the sidewall of the first protrusion is perpendicular to the sidewall of the first protrusion, causing the sidewall of the first protrusion to have no refracting on the outgoing light, that is, the outgoing light is not deflected. The angle β0 of the refracted light formed by the outgoing light passing through the first protrusion 171 is also the smallest. If the inclination angle β of the groove sidewall of the first groove 181 is smaller than β0, the groove sidewall of the first groove 181 may fail in its function.

Therefore, the inclination angle β of the groove sidewall of the first groove 181 is to be limited. The included angle between the groove sidewall of the first groove 181 and the display surface of the display substrate is β, that is, the inclination angle β of the groove sidewall of the first groove 181 may be calculated by the following formula:

$$\beta > \arctan[h/(a+b)]$$

Herein, a is the distance between the edge of the first protrusion 171 and the edge of the sub-pixel 20 in the first direction X, b is the length of the sub-pixel 20 in the first direction X, and h is the distance between the first protrusion 171 and the sub-pixel 20 in the second direction Y.

When the pixel density of the display substrate 100 is 400, it can be calculated that the angle β between the sidewall of the first groove 181 and the display surface of the display substrate 100 is greater than 35°. When the pixel density increases, b may shrink to a certain extent, and the minimum degree (critical angle) of the included angle β may also increase to a certain extent.

When the included angle β is smaller than the critical angle, there is also a certain converging effect on the refracted light.

Referring to FIG. 1, FIG. 6 and FIG. 7, the third light extraction layer 19 is disposed on one side of the second light extraction layer 18 away from the display substrate 100, and a part of the third light extraction layer 19 is disposed within the first groove 181 to form a second protrusion 191. Specifically, the third light extraction layer 19 may include a flat portion 192 and a second protrusion 191, the second protrusion 191 is arranged on one side of the flat portion 192 close to the display substrate 100, so that the second protrusion 191 protrudes toward the side of the display substrate 100, and the interface where the sidewall of the second protrusion 191 connects to the sidewall of the first groove 181 can form a total reflection interface.

Figure 8:
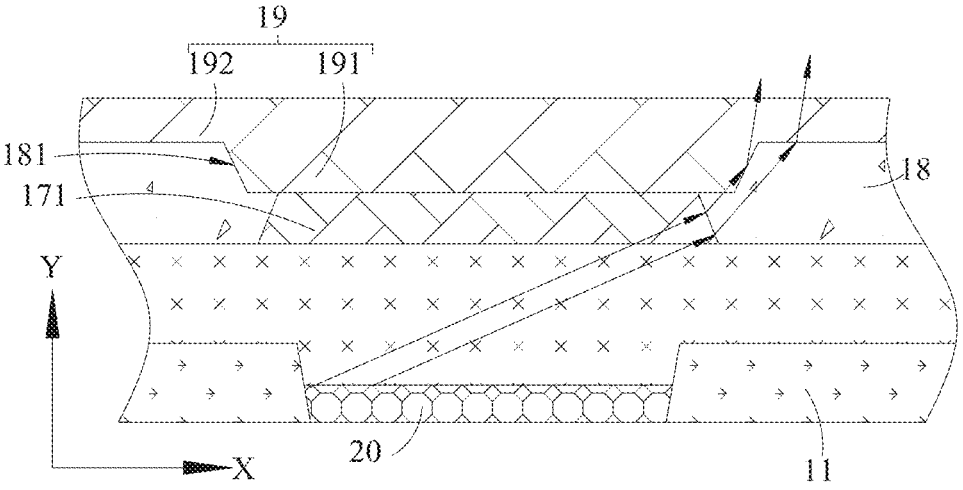
FIG. 8 is a schematic structural diagram of the display panel according to a second exemplary embodiment of this disclosure.

Referring to FIG. 8, the refractive index of the third light extraction layer 19 may be greater than the refractive index of the second light extraction layer 18, so that part of the refracted light irradiating the groove sidewall of the first groove 181 is totally reflected and converged, and another part of the refracted light incident on the interface, which is parallel to the display surface, between the third light extraction layer 19 and the second light extraction layer 18 is refracted again, with the refraction angle being smaller than the incident angle, so that the light is more convergent. The thickness of the third light extraction layer 19 is greater than 0 and less than or equal to 5 microns.

The preparation process of the second light extraction layer 18 and the third light extraction layer 19 may include, firstly, forming a second light extraction material layer and, then, etching the second light extraction material layer to form the first groove 181 and the second light extraction layer 18. Finally, the third light extraction layer 19 is deposited on the side of the second light extraction layer 18 away from the display substrate 100, and the third light extraction layer 19 may naturally be formed within the first groove 181 to form the second protrusion 191.

Referring to the schematic structural diagram of the second exemplary embodiment shown in FIG. 8, the main difference between the second exemplary embodiment and the first exemplary embodiment lies in that: the first groove 181 on the second light extraction layer 18 may be formed as a via hole penetrating the second light extraction layer 18. In this way, the first protrusion 171 and the second protrusion 191 are in contact, and this structure can also achieve the effect of converging the outgoing light. Other structures are the same as those of the first exemplary embodiment, and will not be repeated here.

Figure 9:
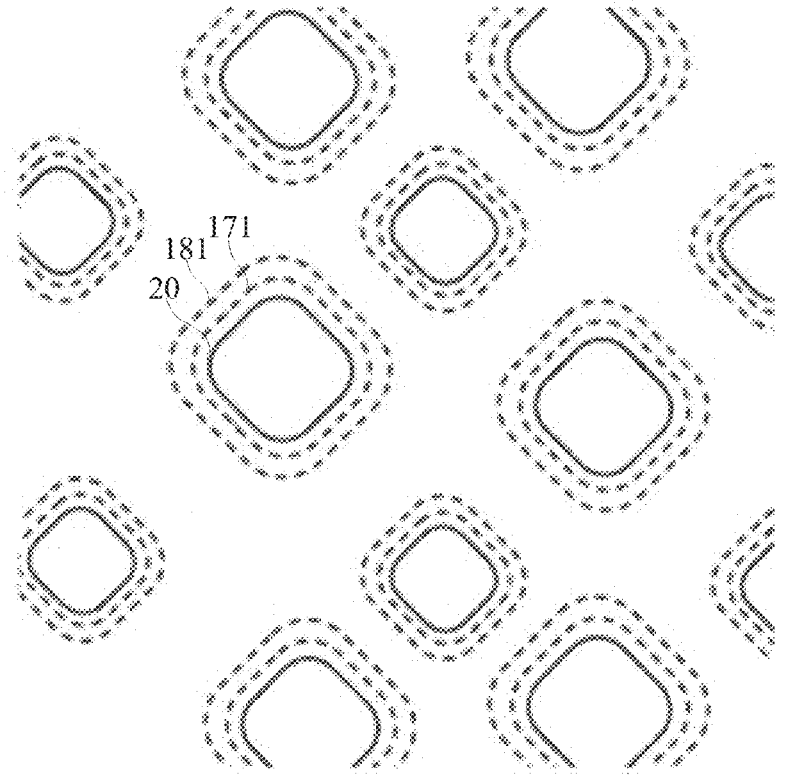
FIG. 9 is a schematic top view of the display panel in FIG. 8.

Referring to FIG. 9, in the second exemplary embodiment, the orthographic projection of the first protrusion 171 on the display substrate 100 covers the sub-pixel 20, and the orthographic projection of the first protrusion 171 on the display substrate 100 is located within the orthographic projection of the first groove 181 on the display substrate 100.

It should be noted that, since the sidewall of the first protrusion 171 is inclined, the range of the orthographic projection of the first protrusion 171 on the display substrate 100 refers to the orthographic projection of the outermost edge of the first protrusion 171 on the display substrate 100, that is, the sub-pixel 20 is located within the orthographic projection of the outermost edge of the first protrusion 171 on the display substrate 100. Since the groove sidewall of the first groove 181 is inclined, the range of the orthographic projection of the first groove 181 on the display substrate 100 refers to the orthographic projection of a surface (groove bottom surface) of the first groove 181 close to the display substrate 100 on the display substrate 100, that is, the orthographic projection of the outermost edge of the first protrusion 171 on the display substrate 100 is located within the orthographic projection of the groove bottom surface of the first groove 181 on the display substrate 100.

Figure 10:
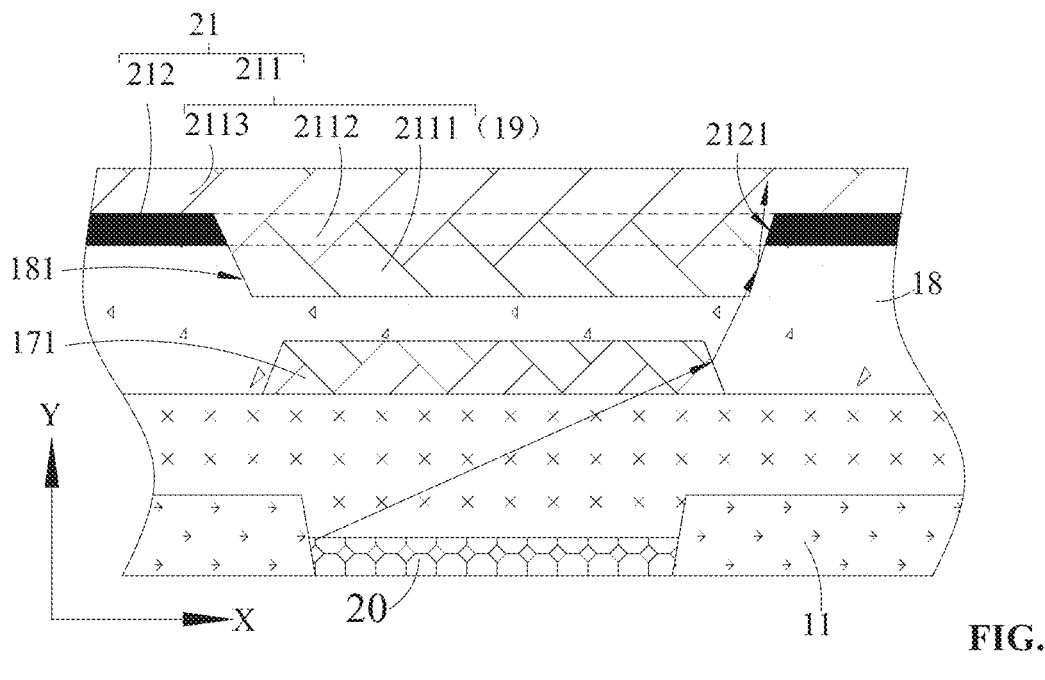
FIG. 10 is a schematic structural diagram of the display panel according to a third exemplary embodiment of this disclosure.

Referring to the schematic structural diagram of the third exemplary embodiment shown in FIG. 10, the main difference between the third exemplary embodiment and the first exemplary embodiment lies in that: the display panel may further include a color filter layer 21, the color filter layer 21 may include a filter portion 211 and a light shielding portion 212, the filter portion 211 may include a red filter portion, a green filter portion and a blue filter portion, red light passes through the red filter portion, green light passes through the green filter portion, and blue light passes through the blue filter portion.

The color filter layer 21 is disposed on the light output side of the display substrate 100. Specifically, the color filter layer 21 is disposed on one side of the second light extraction layer 18 away from the display substrate 100, and the light shielding portion 212 is disposed outside the first groove 181. In other words, a fourth via hole 2121 is disposed on the light shielding portion 212, and the wall of the fourth via hole 2121 is connected with the groove wall of the first groove 181, with the inclination angles thereof being the same. A part of the filter portion 211 is disposed within the first groove 181 to form the second protrusion 191, and another part of the filter portion 211 is disposed on one side of the light shielding portion 212 and the second protrusion 191 away from the display substrate 100 to form a flat portion 192. A part of the filter portion 211 may be reused as the third light extraction layer 19, that is, the filter portion 211 may not only serve as the filter portion 211 to filter light, but also may serve as the third light extraction layer 19 to cooperate with the second light extraction layer 18, thereby achieving the function of converging the refracted light. Other structures are the same as those of the first exemplary embodiment, and will not be repeated here.

Specifically, the filter portion may include a first part 2111, a second part 2112 and a third part 2113 that are stacked in sequence. The first part 2111 is closer to the third light extraction layer than the second part 2112, and the sidewall of the first part 2111 is attached with the sidewall of the first groove. In other words, the sidewall of the first part 2111 is attached with the second light extraction layer.

The first part 2111 is reused as the second protrusion of the third light extraction layer, and the refracted light is totally reflected at the sidewall of the first part 2111. The sidewall of the second part 2112 is attached with the groove sidewall of the fourth via hole 2121, that is, the sidewall of the second part 2112 is attached with the light shielding portion. The third part 2113 is disposed on one side of the second part 2112 and the light shielding portion away from the display substrate. The second part 2112 and the third part 2113 are commonly reused as the flat portion 192 of the third light extraction layer.

Reusing part of the color filter layer 21 as the second protrusion 191 can avoid one step of manufacturing process of the second protrusion 191, thereby increasing the manufacturing efficiency and reducing the cost.

Figure 11:
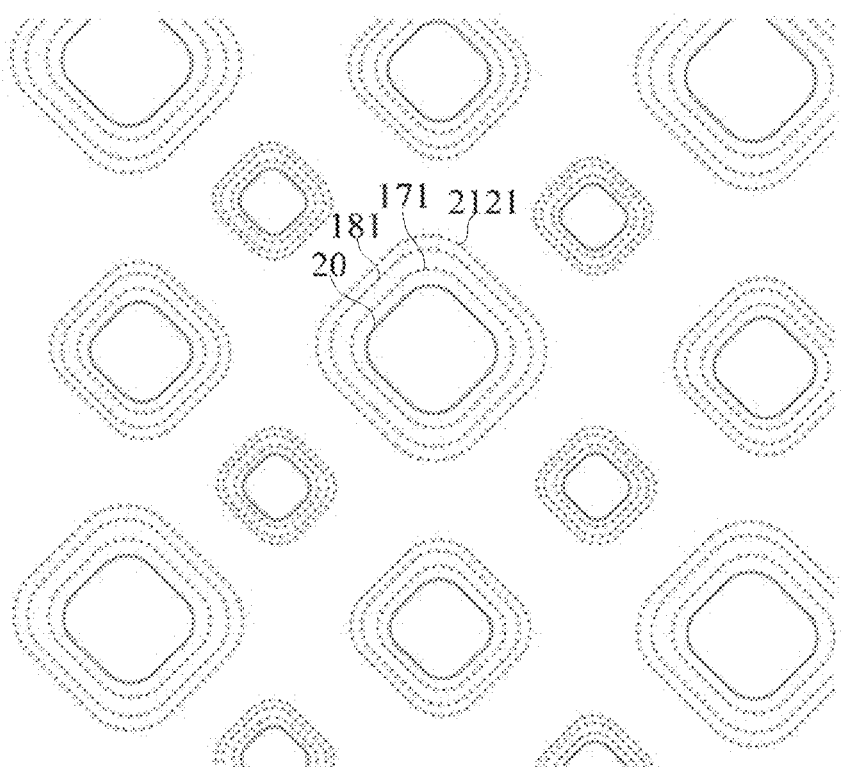
FIG. 11 is a schematic top view of the display panel in FIG. 10.

Referring to FIG. 11, in the third exemplary embodiment, the orthographic projection of the first protrusion 171 on the display substrate 100 covers the sub-pixel 20, and the orthographic projection of the first protrusion 171 on the display substrate 100 is located within the orthographic projection of the first groove 181 on the display substrate 100. The orthographic projection of the first groove 181 on the display substrate 100 is located within the orthographic projection of the fourth via hole 2121 in the light shielding portion 212 on the display substrate 100.

It should be noted that since the wall of the fourth via hole 2121 is inclined, the orthographic projection of the fourth via hole 2121 on the display substrate 100 refers to the orthographic projection of the edge of the fourth via hole 2121 close to the display substrate 100 on the display substrate 100. In other words, the orthographic projection of the first groove 181 on the display substrate 100 is located within the orthographic projection of the edge of the fourth via hole 2121 in the light shielding portion 212 close to the display substrate 100 on the display substrate 100. The orthographic projection of the first protrusion 171 on the display substrate 100 and the orthographic projection of the first groove 181 on the display substrate 100 have been described above in detail, which will not be repeated here.

Figure 12:
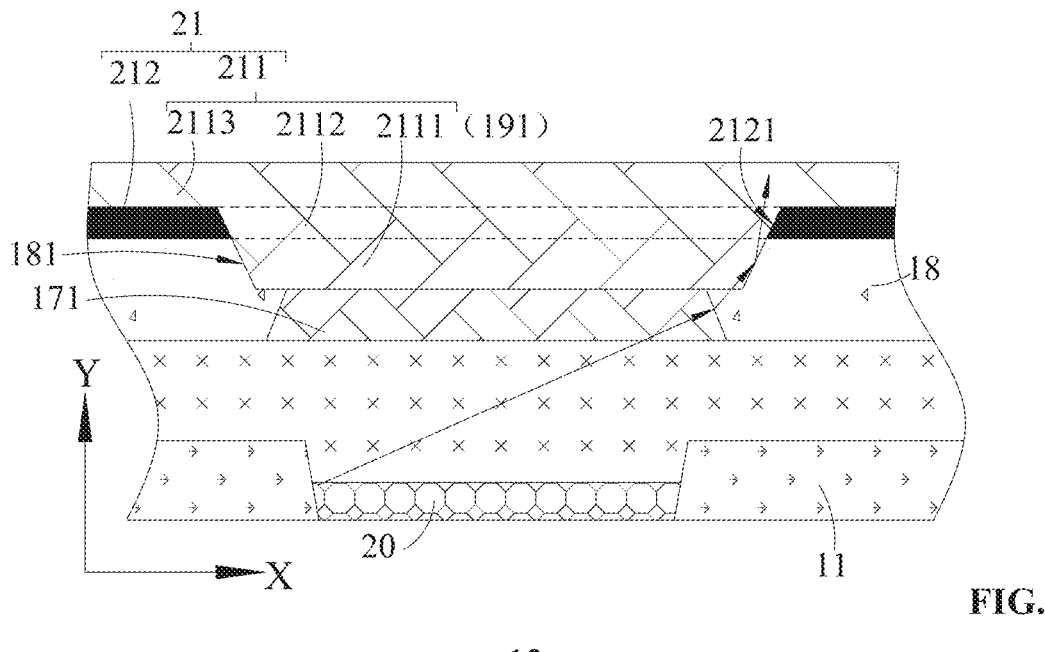
FIG. 12 is a schematic structural diagram of the display panel according to a fourth exemplary embodiment of this disclosure.

Referring to the schematic structural diagram of the fourth exemplary embodiment shown in FIG. 12, the main difference between the fourth exemplary embodiment and the third exemplary embodiment lies in that: the first groove 181 on the second light extraction layer 18 may be formed as the via hole of the light extraction layer 18. In this way, the first protrusion 171 contacts the second protrusion 191, that is, the first protrusion 171 contacts the filter portion 211. This structure can also achieve the effect of converging the outgoing light. Other structures are the same as those of the third exemplary implementation manner, and will not be repeated here.

Figure 13:
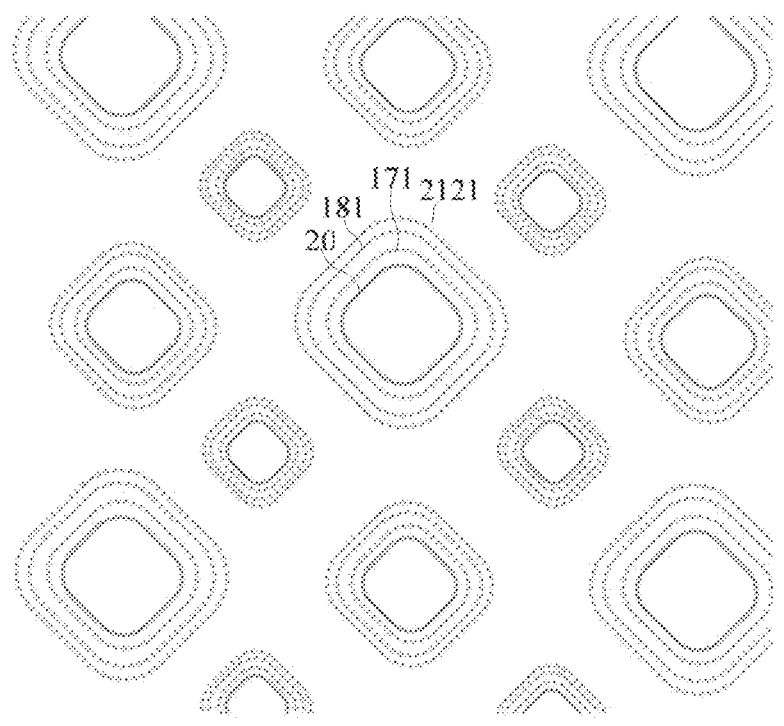
FIG. 13 is a schematic top view of the display panel in FIG. 12.

Referring to FIG. 13, in the fourth exemplary embodiment, the orthographic projection of the first protrusion 171 on the display substrate 100 covers the sub-pixel 20, and the orthographic projection of the first protrusion 171 on the display substrate 100 is located within the orthographic projection of the first groove 181 on the display substrate 100. The orthographic projection of the first groove 181 on the display substrate 100 is located within the orthographic projection of the fourth via hole 2121 in the light shielding portion 212 on the display substrate 100. The orthographic projection of the first protrusion 171 on the display substrate 100, the orthographic projection of the first groove 181 on the display substrate 100, and the orthographic projection of the fourth via hole 2121 on the display substrate 100 have been described in detail, which will not be repeated here.

Referring to FIG. 14-FIG. 17, the height of the sidewall of the first groove 181 in the second direction Y decreases as the distance from the sidewall to the sub-pixel 20 in the first direction X increases. The third light extraction layer 19 is only arranged in the first groove 181 to form the second protrusion 191, that is, the third light extraction layer 19 only includes the second protrusion 191. The refracted light refracted by the first protrusion 171 may be refracted again at the interface between the second protrusion 191 and the second light extraction layer 18. Moreover, since the refractive index of the third light extraction layer 19 is greater than that of the second light extraction layer 18, the refraction angle is greater than the incident angle, so that the light converges and emits from the front of the display panel, thereby improving the light extraction efficiency.

Figure 14:
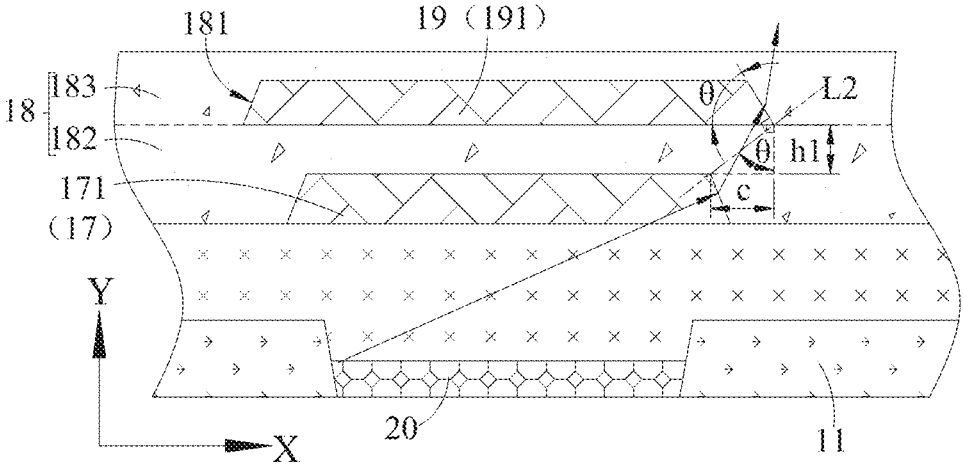
FIG. 14 is a schematic structural diagram of the display panel according to a fifth exemplary embodiment of this disclosure.

Referring to FIG. 14, the second light extraction layer 18 may include a first layer 182 and a second layer 183, and the second layer 183 is disposed on one side of the first layer 182 away from the display substrate 100. The first layer 182 is arranged on the light output side of the display substrate 100. Specifically, the first layer 182 is arranged on one side of the encapsulation layer group 14 and the first light extraction layer 17 away from the display substrate 100, so that the first layer 182 completely covers the first light extraction layer 17. The first groove 181 is disposed on the second layer 183 and is located on one side of the second layer 183 close to the display substrate 100, so that the second layer 183 covers the third light extraction layer 19 (the second protrusion 191).

The refracted light emitted from the sidewall of the first protrusion 171 is preferably all incident on the sidewall of the second protrusion 191, so the refracted light can be refracted again. The refracted light emitted from the sidewall of the first protrusion 171 is to be located on the same side of the second normal line L2 of the sidewall of the second protrusion 191 and, specifically, is to be located on one side of the second normal line L2 of the sidewall of the second protrusion 191 close to the display substrate 100. Only in this way can the refracted light have a converging effect. Moreover, the sidewall of the first protrusion 171 and the groove sidewall of the first groove 181 (the sidewall of the second protrusion 191) are located in the same section along the second direction Y, and the sidewall of the first protrusion 171 and the groove sidewall of the second groove 181 (the sidewall of the second protrusion 191) is located on the same side, for example, the light from the left sidewall of the first protrusion 171 will not be emitted to the right side in FIG. 14.

Referring to FIG. 14, the inclination angle of the sidewall of the second protrusion 191 is θ, and the distance between the first protrusion 171 and the second protrusion 191 in the second direction Y is h1. In the first direction X, the distance between the edge of the first protrusion 171 close to the second protrusion 191 and the edge of the second protrusion 191 close to the first protrusion 171 is c, the value of c is greater than zero, and θ≥arc tan(c/h1). Therefore, the inclination angle of the sidewall of the second protrusion 191 can be determined as θ through the above formula.

Figure 15:
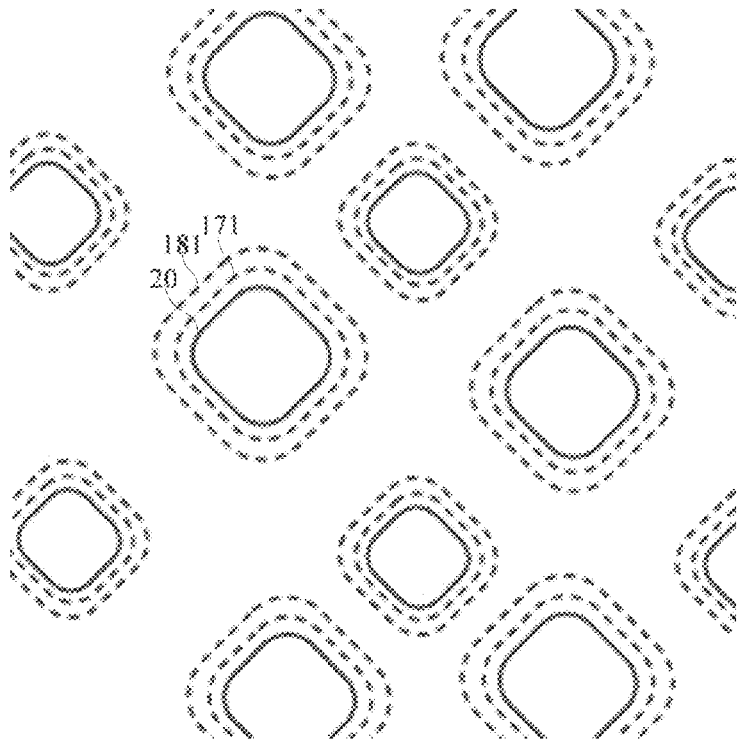
FIG. 15 is a schematic top view of the display panel in FIG. 14.

Referring to FIG. 15, in the fifth exemplary embodiment, the orthographic projection of the first protrusion 171 on the display substrate 100 covers the sub-pixel 20, and the orthographic projection of the first protrusion 171 on the display substrate 100 is located within the orthographic projection of the first groove 181 on the display substrate 100, that is, the orthographic projection of the first protrusion 171 on the display substrate 100 is located within the orthographic projection of the second protrusion 191 on the display substrate 100. The orthographic projection of the first protrusion 171 on the display substrate 100 and the orthographic projection of the first groove 181 on the display substrate 100 have been described in detail, which will not be repeated here.

Figure 16:
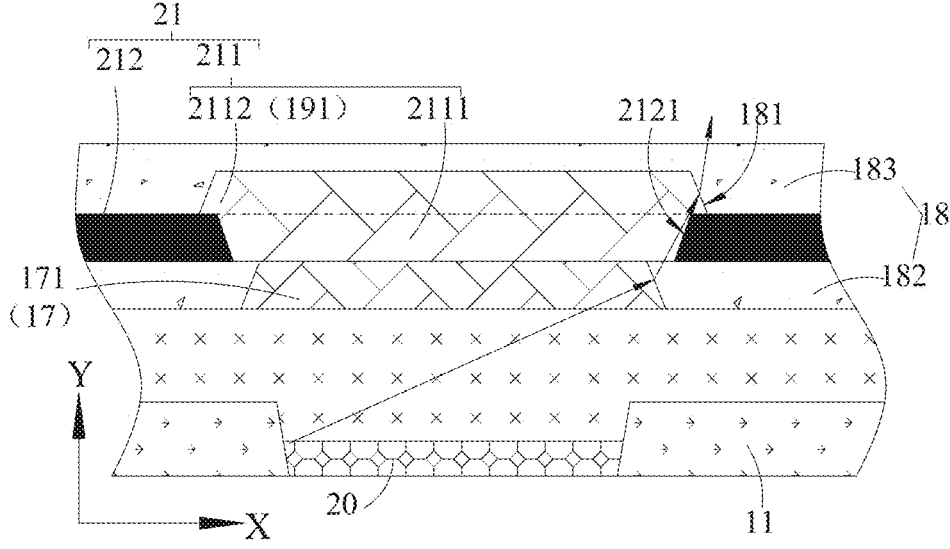
FIG. 16 is a schematic structural diagram of the display panel according to a sixth exemplary embodiment of this disclosure.

Referring to FIG. 16, the structure of the first protrusion 171 is the same as that of the above-mentioned embodiments, so details will not be repeated here. The second light extraction layer 18 may include a first layer 182 and a second layer 183. The first layer 182 is arranged on the light output side of the display substrate 100. Specifically, the first layer 182 is arranged on one side of the encapsulation layer group 14 away from the display substrate 100, and the height of the first layer 182 in the second direction Y is substantially the same as the height of the first protrusion 171 in the second direction Y, so that the first layer 182 covers the encapsulation layer group 14 and the sidewall of the first protrusion 171.

The display panel may further include a color filter layer 21, the color filter layer 21 may include a filter portion 211 and a light shielding portion 212, and the filter portion 211 may include a red filter portion 211, a green filter portion 211 and a blue filter portion 211.

The color filter layer 21 is disposed on one side of the first light extraction layer 17 and the first layer 182 away from the display substrate 100. The filter portion 211 is arranged on the side of the first light extraction layer 17 away from the display substrate 100, that is, the filter portion 211 is arranged opposite to the first light extraction layer 17. The light shielding portion 212 is arranged on the side of the first layer away from the display substrate 100, that is, the light shielding portion 212 is disposed opposite to the first layer 182.

The filter portion 211 may be reused as the third light extraction layer 19, that is, the filter portion 211 can be used as the filter portion 211 to filter light, and can also be used as the third light extraction layer 19 to cooperate with the second light extraction layer 18, thereby achieving the function of converging the refracted light.

Specifically, the filter portion 211 may include a first part 2111 and a second part 2112 that are stacked. The second part 2112 is located on one side of the first part 2111 away from the display substrate 100. The first part 2111 connects the light shielding portion 212. The thickness of the first part 2111 in the second direction is substantially the same as the thickness of the light shielding portion 212. The second part 2112 protrudes from the first part 2111 in the first direction, the sidewall of the second part 2112 is formed as an inclined surface, and the inclined surface can refract the incident refracted light again. Accordingly, the second part 2112 can be reused as the second protrusion 191. The calculation method of the inclination angle of the sidewall of the second portion 2112 is the same as the calculation method of the inclination angle θ of the sidewall of the second protrusion 191 in the fifth exemplary embodiment, and will not be repeated here. Reusing part of the color filter layer 21 as the second protrusion 191 can reduce one step of manufacturing process of the second protrusion 191, thereby increasing the manufacturing efficiency and reducing the cost.

It should be noted that the distance h1 between the first protrusion 171 and the second protrusion 191 in the second direction Y is the thickness of the first part 2111 or the light shielding portion 212.

The second layer 183 is disposed on one side of the color filter layer 21 away from the display substrate 100. The first groove 181 is disposed on the second layer 183, and is located on one side of the second layer 183 close to the display substrate 100, so that the second layer 183 covers the third light extraction layer 19 (the second protrusion 191).

Figure 17:
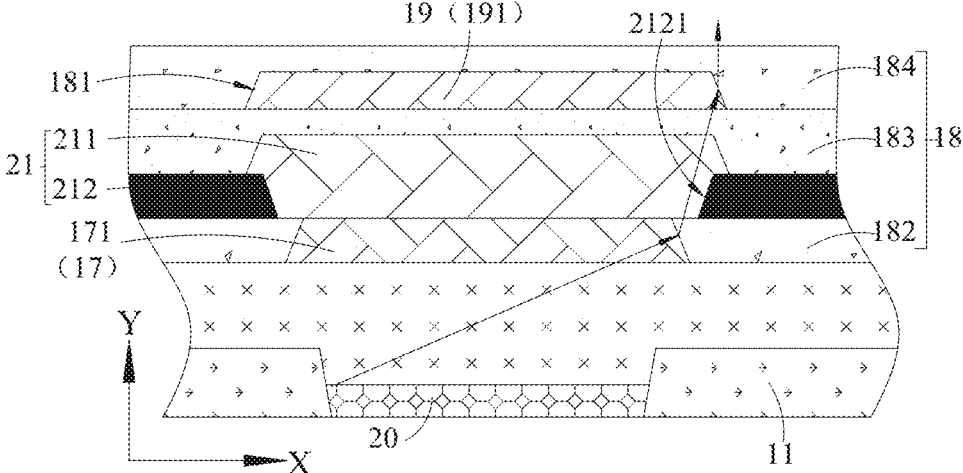
FIG. 17 is a schematic structural diagram of the display panel according to a seventh exemplary embodiment of this disclosure.

Referring to FIG. 17, in some exemplary embodiments, the filter portion 211 is not reused as the third light extraction layer 19, and the structure of the first protrusion 171 is the same as that of the above-mentioned embodiments, which is not repeated here.

The second light extraction layer 18 may include a first layer 182, a second layer 183 and a third layer 184. The first layer 182 is disposed on the light output side of the display substrate 100. Specifically, the first layer 182 is disposed on one side of the encapsulation layer group away from the display substrate 100, and the height of the first layer 182 in the second direction Y is substantially the same as that of the first protrusion 171 in the second direction Y, so that the first layer 182 covers the encapsulation layer group and the sidewall of the first protrusion 171.

The display panel may further include the color filter layer 21, the color filter layer 21 may include the filter portion 211 and the light shielding portion 212, and the filter portion 211 may include the red filter portion 211, the green filter portion 211 and the blue filter portion 211.

The color filter layer 21 is disposed on one side of the first light extraction layer 17 and the first layer 182 away from the display substrate 100. The filter portion 211 is arranged on one side of the first light extraction layer 17 away from the display substrate 100, that is, the filter portion 211 is arranged opposite to the first light extraction layer 17. The light shielding portion 212 is arranged on one side of the first layer 182 away from the display substrate 100, that is, the light shielding portion 212 is arranged opposite to the first layer 182.

The light filter portion 211 may include a first part 2111 and a second part 2112 that are stacked. The second part 2112 is located on one side of the first part 2111 away from the display substrate 100. The first part 2111 is connected to the light shielding portion 212. In the second direction, the thickness of the first part 2111 is substantially the same as the thickness of the light shielding portion 212. The second part 2112 protrudes from the first part 2111 in the first direction. Since the second part 2112 is not reused as the third light extraction layer 19, the width of the second part 2112 in the first direction is configured to be relatively great in some exemplary embodiments, so as to prevent light from exiting from the sidewall of the filter portion 211, but to allow light to exit from one side of the filter portion 211 away from the display substrate 100.

The second layer 183 is disposed on the side of the color filter layer 21 away from the display substrate 100, and the second layer 183 completely covers the color filter layer 21.

The third light extraction layer 19 is provided on one side of the second layer 183 away from the display substrate 100, and the specific structure of the third light extraction layer 19 is the same as that of the third light extraction layer 19 in the fourth exemplary embodiment, which will not be repeated here.

The third layer 184 is arranged on one side of the second layer 183 and the third light extraction layer 19 away from the display substrate 100, the first groove 181 is arranged on the third layer 184, and is located on one side of the third layer 184 close to the display substrate 100. Therefore, the third layer 184 covers the third light extraction layer 19 (the second protrusion 191).

Referring to FIG. 11, the second layer 183 may not be provided, and the second protrusion 191 may be directly formed on one side of the color filter layer 21 away from the base substrate 1.

Referring to FIG. 1, the display panel may also include a circular polarizer 15 and a cover plate 16. The circular polarizer 15 is arranged one the side of the third light extraction layer away from the display substrate. The circular polarizer 15 may include a ¼ wave plate 151 and a polarizer 152 that are stacked in sequence, where the ¼ wave plate 151 is closer to the display substrate 100 than the polarizer 152. The cover plate 16 is disposed on one side of the circular polarizer 15 away from the display substrate 100.

Based on the same inventive concept, exemplary embodiments of this disclosure provide a display device, which may include any one of the display panels described above. The specific structure of the display panel has been described in detail above, which will not be repeated here.

The specific type of the display device is not particularly limited, and any type of display device commonly used in the art can be used, for example, mobile devices such as mobile phones, wearable devices such as watches, VR devices, and the like, which may be selected by those skilled in the art according to specific use of the display device, and will not be elaborated here.

It should be noted that in addition to the display panel, the display device also includes other necessary parts and components. Taking the display as an example, it may further include, for example, a casing, a circuit board, a power cord, and the like, which may be provided by those skilled in the art according to specific usage requirements of the display device, and will not be elaborated here.

Compared with the related art, the beneficial effect of the display device according to some exemplary embodiments of the disclosure is the same as that of the display panel according to the above exemplary embodiments, which will not be repeated here.

Other embodiments of this disclosure will be readily apparent to those skilled in the art from consideration of the specification and practice of the invention disclosed herein. This application is intended to cover any modification, use or adaptation of this disclosure, and these modifications, uses or adaptations follow the general principles of this disclosure and include common knowledge or conventional technical means in the technical field not disclosed in this disclosure. The specification and examples are to be considered exemplary only, with the actual scope and spirit of the disclosure being indicated by the appended claims.

What is claimed is:

1. A display panel, comprising:
   a display substrate, comprising a plurality of sub-pixels;
   a first light extraction layer, arranged on a light output side of the display substrate, wherein the first light extraction layer comprises a plurality of first protrusions, and an orthographic projection of the first protrusions on the display substrate overlaps with an orthographic projection of the sub-pixels on the display substrate; and
   a second light extraction layer, arranged on a side of the first light extraction layer away from the display substrate and covering at least part of the first protrusions, wherein the second light extraction layer comprises a plurality of first grooves, the orthographic projection of the first protrusions on the display substrate overlaps with an orthographic projection of the first grooves on the display substrate, and a refractive index of the second light extraction layer is smaller than a refractive index of the first light extraction layer.

2. The display panel according to claim 1, wherein the display panel further comprises:

a third light extraction layer, arranged on a side of at least part of the second light extraction layer away from the display substrate, wherein at least part of the third light extraction layer is located within the first groove, and a refractive index of the third light extraction layer is greater than the refractive index of the second light extraction layer.

3. The display panel according to claim 2, wherein a height of a sidewall of the first protrusion in a second direction decreases with increase of a distance from the sidewall to a center of the sub-pixel in a first direction, the second direction is perpendicular to a display surface of the display substrate, and the first direction is parallel to the display surface of the display substrate.

4. The display panel according to claim 3, wherein the sub-pixel is located on a same side of a first normal line L1 of the sidewall of the first protrusion, and are located on a side of the first normal line L1 away from the second light extraction layer.

5. The display panel according to claim 3, wherein an angle between the sidewall of the first protrusion and the display surface of the display substrate is a, and $$\alpha \geq \arctan\left[(a+b)/h\right];$$

wherein a is a distance between an edge of the first protrusion and an edge of the sub-pixel in the first direction, b is a length of the sub-pixel in the first direction, and h is a distance between the first protrusion and the sub-pixel in the second direction.

6. The display panel according to claim 3, wherein a height of a groove sidewall of the first groove in the second direction increases with increase of a distance from the groove sidewall to the center of the sub-pixel in the first direction.

7. The display panel according to claim 6, wherein an angle between the groove sidewall of the first groove and the display surface of the display substrate is β, $$\beta > \arctan\left[h/(a+b)\right];$$

wherein a is a distance between an edge of the first protrusion and an edge of the sub-pixel in the first direction, b is a length of the sub-pixel in the first direction, and h is a distance between the first protrusion and the sub-pixel in the second direction.

8. The display panel according to claim 6, wherein the display panel further comprises:

a color filter layer, arranged on the light output side of the display substrate, wherein the color filter layer comprises a filter portion and a light shielding portion.

9. The display panel according to claim 8, wherein the color filter layer is arranged on a side of the second light extraction layer away from the display substrate, and at least part of the filter portion is used as the third light extraction layer.

10. The display panel according to claim 9, wherein the filter portion comprises a first part and a second part stacked in sequence, the first part is closer to the second light extraction layer than the second part, and the first part is used as a second protrusion of the third light extraction layer.

11. The display panel according to claim 3, wherein a height of a groove sidewall of the first groove in the second direction decreases with increase of a distance from the groove sidewall to the center of the sub-pixel in the first direction.

12. The display panel according to claim 11, wherein the sidewall of the first protrusion is located on a same side of a second normal line of the groove sidewall of the first groove, and is located on a side of the second normal line close to the display substrate, and the sidewall of the first protrusion and the groove sidewall of the first groove are located on a same side of a same section along the second direction.

13. The display panel according to claim 11, wherein the third light extraction layer is disposed within the first groove, and the third light extraction layer disposed within the first groove is a second protrusion.

14. The display panel according to claim 13, wherein the second light extraction layer comprises:

a first layer, arranged on the light output side of the display substrate and covering at least part of the first protrusions; and a second layer, arranged on a side of the first layer away from the display substrate, wherein the first grooves are arranged at the second layer.

15. The display panel according to claim 14, wherein the display panel further comprises:

a color filter layer, arranged on a side of the first light extraction layer and the first layer away from the display substrate, wherein the color filter layer comprises a filter portion and a light shielding portion, and the second layer is located on a side of the color filter layer away from the display substrate.

16. The display panel according to claim 15, wherein at least part of the filter portion is used as the third light extraction layer.

17. The display panel according to claim 16, wherein the filter portion comprises a first part and a second part stacked in sequence, and the first part is closer to the second light extraction layer than the second part, and the second part is used as the third light extraction layer.

18. The display panel according to claim 15, wherein the second light extraction layer further comprises:

a third layer, arranged between the first layer and the second layer, and located on the side of the color filter layer away from the display substrate.

19. The display panel according to claim 2, wherein the first groove is provided as a via hole.

20. A display device, comprising a display panel, wherein the display panel comprises:

a display substrate, comprising a plurality of sub-pixels;

a first light extraction layer, arranged on a light output side of the display substrate, wherein the first light extraction layer comprises a plurality of first protrusions, and an orthographic projection of the first protrusions on the display substrate overlaps with an orthographic projection of the sub-pixels on the display substrate; and a second light extraction layer, arranged on a side of the first light extraction layer away from the display substrate and covering at least part of the first protrusions, wherein the second light extraction layer comprises a plurality of first grooves, the orthographic projection of the first protrusions on the display substrate overlaps with an orthographic projection of the first grooves on the display substrate, and a refractive index of the second light extraction layer is smaller than a refractive index of the first light extraction layer.

\* \* \* \* \*